United States Patent [19]

Rahilly

[11] 4,385,198
[45] May 24, 1983

[54] GALLIUM ARSENIDE-GERMANIUM HETEROFACE JUNCTION DEVICE

[75] Inventor: W. Patrick Rahilly, Spring Valley, Ohio

[73] Assignee: The United States of America as represented by the Secretary of the Air Force, Washington, D.C.

[21] Appl. No.: 281,437

[22] Filed: Jul. 8, 1981

[51] Int. Cl.³ .......................................... H01L 31/06
[52] U.S. Cl. ..................................... 136/249; 136/261; 136/262; 148/191; 357/16; 357/30; 357/63
[58] Field of Search .................. 136/249 TJ, 261, 262; 357/16, 17, 30, 33, 63; 148/191

[56] References Cited

U.S. PATENT DOCUMENTS 4,128,733 12/1978 Fraas et al. .......................... 136/255
4,191,593 3/1980 Cacheux ............................. 136/259

Primary Examiner—Aaron Weisstuch
Attorney, Agent, or Firm—Donald J. Singer; Bernard E. Franz

[57] ABSTRACT

Doping with one of the Group Ia elements Li, Na or K near the heteroface junction produces P+ conductivity in the gallium arsenide and N+ conductivity in the germanium. The device can be used, for example, as a dual bandgap solar cell. The fabrication includes implanting the Group Ia dopant in a Ge wafer. This dopant diffuses into the GaAs when it is subsequently deposited on the Ge.

26 Claims, 8 Drawing Figures

GALLIUM ARSENIDE-GERMANIUM HETEROFACE JUNCTION DEVICE

RIGHTS OF THE GOVERNMENT

The invention described herein may be manufactured and used by or for the Government of the United States for all governmental purposes without the payment of any royalty.

BACKGROUND OF THE INVENTION

This invention relates generally to semiconductor devices having GaAs/Ge heteroface junctions, and more particularly in one embodiment to multi-junction solar cells.

Many types of heteroface junctions have been fabricated. Generally these junctions have been used for ultra high speed switching, microwave amplification, and binary memory. III-V/Ge heterofaces, in particular, have been investigated including theoretical analysis and fabrication approaches. Much information can be found in the literature on the subject. An excellent compendium of information can be obtained from the text book "Physics of Semiconductor Devices" by Simon M. Sze, Wiley-Interscience.

Some heteroface junctions have been considered for cascaded dual bandgap solar cells. The GaAs on Ge heterojunction has been investigated to some extent.

Efforts in solar cell technology include, among other things, attempts to increase the solar cell conversion efficiency, and one approach to this problem has been the utilization of stacked or tandem connected semiconductor wafers in a structure responsive to different wavelength ranges of sunlight. The stacked PN junctions will generate a combined power which is greater than the individual power outputs from the individual PN junctions.

A second approach to the problem of increasing the efficiency and output power of solar cells is to epitaxially grow multiple layers of different III-V semiconductor compound materials vertically upward from one surface of a suitable substrate material, see for example U.S. Pat. No. 4,017,332 to James. U.S. Pat. No. 4,128,733 to Fraas et al covers a single-wafer dual-bandgap solar cell including a gallium arsenide/germanium heteroface structure.

U.S. Pat. No. 3,271,637 discloses, inter alia, fabrication of a GaAs solar detector comprising vapor-depositing a film of N-type gallium arsenide directly upon a manganese substrate whereby a slight amount of manganese diffusion into the gallium arsenide is effected at the gallium arsenide-manganese interface, resulting in a P-N junction within the deposited gallium arsenide film. The James U.S. Pat. No. 4,017,332 discloses that during epitaxial growth of one layer (InP P-doped with zinc or magnesium) on another layer (InGaAs), and during growth of subsequent layers, some of the P-type dopant in the first layer will diffuse into the other layer due to the high temperatures used in growth, thereby forming an opposite conductivity type region within the other layer and just below its junction with the first layer. Similarly, other layers and junctions are produced.

U.S. Pat. No. 4,126,930 to Moon relates to semiconductive materials useful in devices such as solar voltaic cells and involves magnesium diffusion during epitaxial growth of a magnesium doped AlGaAs layer on an underlying GaAs layer producing a thin layer of Mg-doped P-type GaAs and a P-N junction with the underlying N-type GaAs.

Other art of general interest includes my U.S. Pat. Nos. 4,070,205 and 4,116,717, U.S. Pat. No. 4,179,702 to Lamorte, and U.S. Pat. No. 3,368,125 to Pasierb.

SUMMARY OF THE INVENTION

An object of the invention is to provide for simpler fabrication of a device having a GaAs/Ge heteroface junction for various applications, including solar cells.

According to the invention, a high quality P+ gallium arsenide/N+ germanium (P+GaAs/N+Ge) heteroface junction is formed by using a single species of electrical dopant from group Ia (lithium, sodium or potassium).

The invention is useful in one embodiment as a dual band gap solar cell, with one solar conversion junction in the GaAs and another in the Ge.

DETAILED DESCRIPTION

The presently preferred embodiment of the invention illustrated in FIGS. 1a–1e (not to scale) is useful as a dual band gap solar cell. The feasibility of this invention is related to the properties of group Ia elements (Li, Na or K) when used as electrical dopants in GaAs and in Ge. For example, Li is known to be an N dopant in Ge and a P dopant in GaAs. Further, these elements are mobile in both Ge and GaAs at temperatures of 650° C. to 850° C. and higher if needed. Depending on doping levels for the group Ia elements in the GaAs and Ge, several devices can be made. There are many uses for various embodiments of the invention which are related to light emitting diodes (LED), impact avalanch and transit time devices (IMPATT Diodes), etc. The cascaded multiple bandgap solar cell is one example.

Returning now to FIG. 1a, the starting point for fabrication of the semiconductor device is a wafer 12 of single crystal Ge of P-type conductivity. The wafer 12 is given suitable surface polishing and etching treatments to prepare for the next step.

Figure 1A:
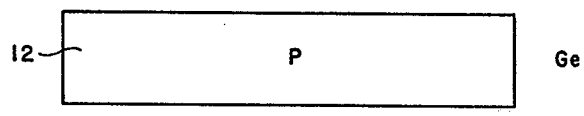
FIGS. 1a–1e are diagrams showing formation of a semiconductor solar cell device according to the invention.
Figure 1B:
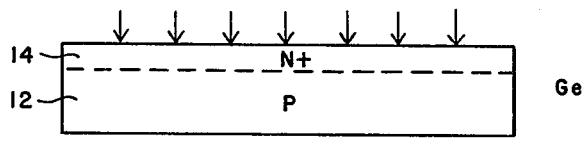

In FIG. 1b, the wafer 12 is ion implanted with a selected group Ia element such as Li or Na or possibly K. Alternatively, furnace diffusion may be used to implant the group Ia dopant in this step. The ion implantation of one of these group Ia dopants can be controlled by both implantation energy and implant dose. An N+ layer 14 is created in the top of the Ge wafer 12 by doping. Ion implantation of impurities to create heavily, moderately or lightly doped layers is known.

Figure 1C:
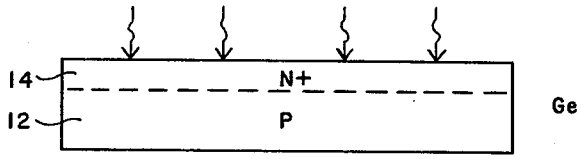
Figure 1D:
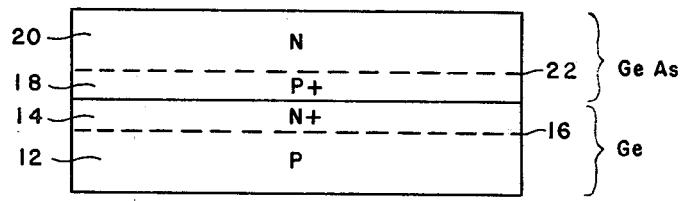

In FIG. 1c, the ion implant damage is then annealed out to achieve an N+ region 14 in the vicinity of the wafer surface. The anneal step can be carried out by using a pulsed laser or electron beam to accomplish rapid thermal anneal of the implant damage while limiting the diffusion of the dopant over large distances. The anneal step is effective to reduce or eliminate the crystalline damage produced by the implant process. It is preferred that the anneal be accomplished by using a pulsed electron beam. The pulsed electron beam annealing of ion implanted regions to provide an anneal without having to subject the whole of the semiconductor wafer to elevated temperatures is known in the art. Depending on the specific heteroface junction design, the ion implanted and annealed Ge wafer can be prepared to be top surface etched to achieve survival of that region shown in FIG. 2 that has dopant densities below the peak value which lies below the top surface. The horizontal axis shows the depth into the Ge substrate in microns (or micrometers). The vertical axis is the logarithm to base 10 of N, where N is the number of dopant atoms per cubic centimeter.

Figure 2:
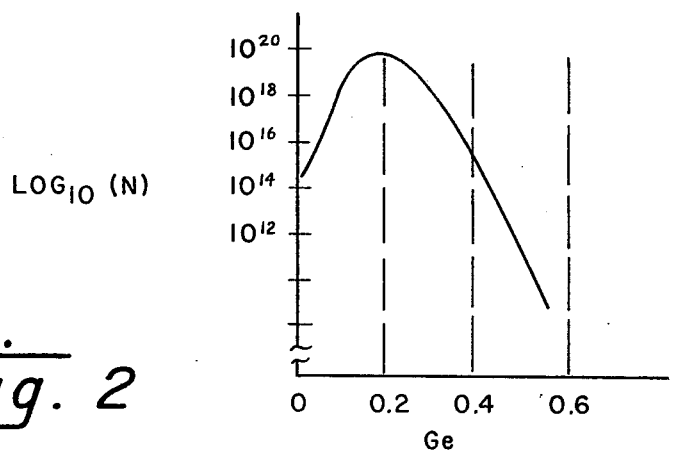
FIGS. 2 and 3 are graphs showing the concentration of the group Ia dopant.
Figure 3:
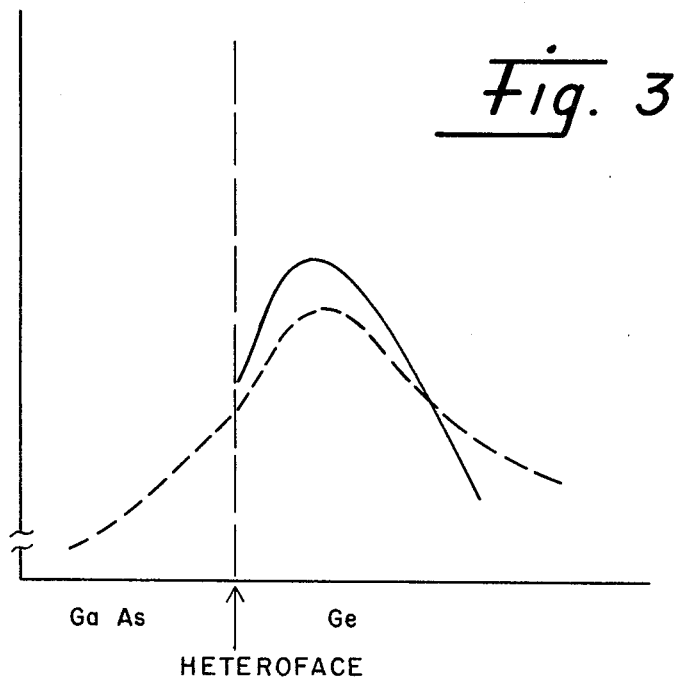

The Ge wafer is then prepared in the usual way for placing into a GaAs vapor deposition system for growing a GaAs layer on the Ge surface containing the implanted region 14. Once placed in the GaAs growth reactor, the temperature of GaAs growth is established by the usual electronic control panel and computer interface methods and growth of the GaAs layer is initiated. As the GaAs layer growth proceeds (FIG. 1d) the implanted dopant (Li, Na or K) diffuses out of the Ge surface and into the thickening GaAs layer, thereby establishing a P+ region 18 which is adjacent to the N+ region 14 of the Ge. The dopant entering the GaAs layer is governed by diffusion processes that result in a dopant profile as shown in FIG. 3. The axes and units correspond to FIG. 2, with zero depth at the heteroface junction. The solid line is the initial dopant distribution in the Ge as shown in FIG. 2, and the dashed line is the final dopant distribution. The grown GaAs layer thickness and Fermi level are controlled both by the dopant entering from the Ge substrate, time and temperature parameters of the growth furnace, decomposition of the Ga and As sources (trimethyl Ga and AsH$_3$ for example) and the dopant selected for the upper GaAs layer. This latter dopant may be Te for N-type conductivity as shown for region 20 in FIG. 1d. The Te dopant is supplied during the entire growth of regions 18 and 20, with the group Ia dopant overcompensating in region 18 to obtain the P+ conductivity.

The resultant structure produced by growing the GaAs layer on the Ge layer having the surface implanted with a group Ia dopant is a high bandgap GaAs region with P+ conductivity on a low bandgap Ge region with N+ conductivity.

For a multiple bandgap solar cell, there is an electrically series connected GaAs cell on a Ge cell. The structure is made as discussed above starting with a P-type Ge wafer, implanted with the group Ia dopant, on which the GaAs is grown. As the GaAs layer grows, the mobile group Ia dopant moves into the N-type GaAs, thus forming a PN photovoltaic junction 22 device during the same processing step as the P+GaAs/N+Ge heteroface junction is formed. The P+GaAs/N+Ge junction serves as a transparent, ohmic series connection between the upper GaAs cell (with PN junction 22) and the lower Ge cell (with PN junction 16). The conduction of majority carriers through the heteroface junction is accomplished by defect tunneling (interface states) as well as some conduction by band-to-band transitions.

Figure 1E:
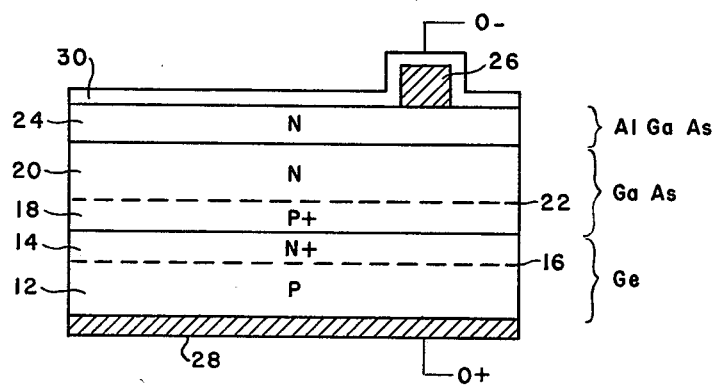

The next step is to cap the N-type GaAs surface by growing a high bandgap AlGaAs window layer 24 to reduce the surface recombination effects. Contacts 26, 28 and a three-layer antireflective coating 30 are then applied. The three-layer antireflective coating is used to extend light absorption into the one to two micrometer wavelength region. The completed solar cell device is shown in FIG. 1e.

Figure 4:
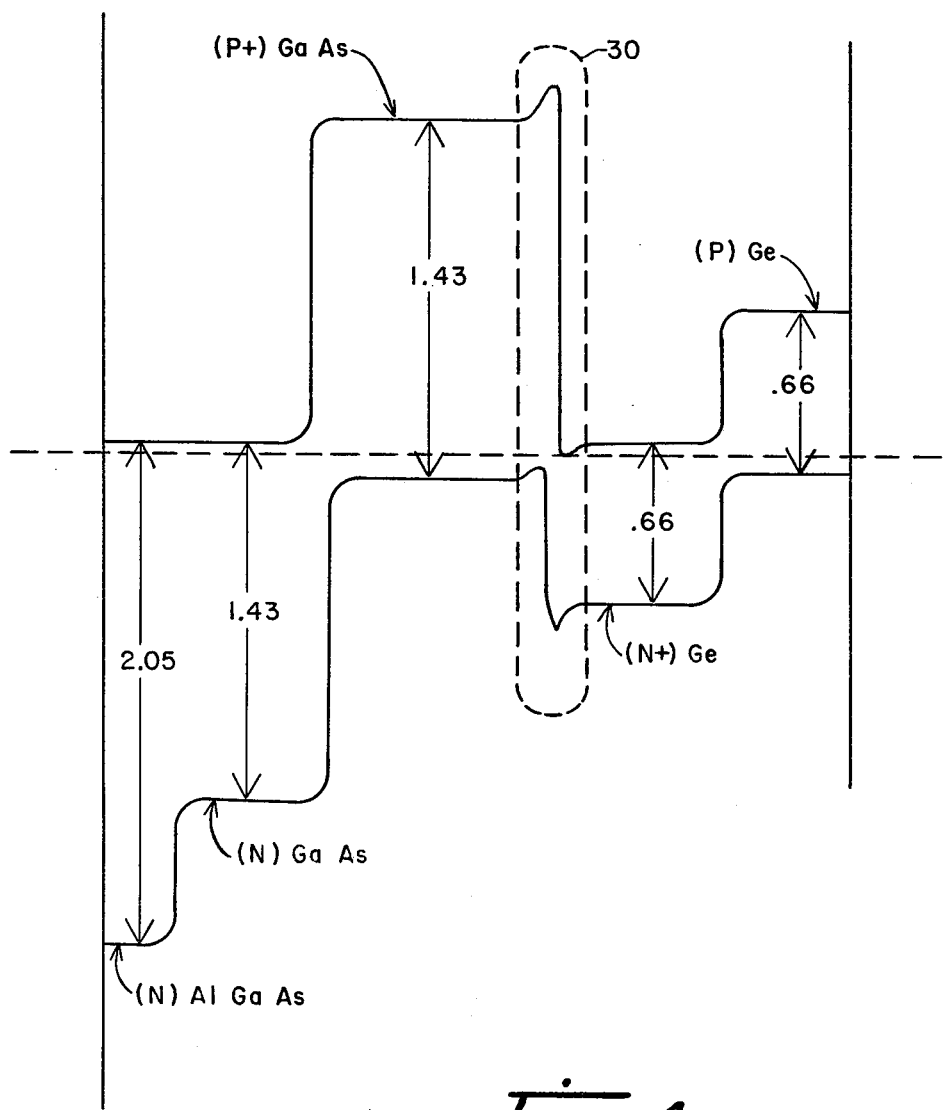
FIG. 4 is a band gap diagram of the solar cell of FIG. 1e.

A band diagram is shown in FIG. 4. The horizontal dashed line is the Fermi level. The numbers designate the bandgap energies in electron-volts. The dashed line 30 shows the heteroface junction region.

For the solar cell application, Na or K is preferred as the group Ia dopant since they possess low diffusion coefficients compared to Li.

ALTERNATIVE EMBODIMENTS

There are many uses for the invention which are related to light emitting diodes (LED), impact, avalanche and transit time devices (IMPATT diodes), etc.

Changing the type of conductivity, or adding aluminum to the GaAs, results in distinctly different properties for the various uses. In the Ge wafer 12, the conductivity may be P or N or intrinsic (I). Independently, the conductivity of the GaAs 20 may be P or N or intrinsic. In each case, the Ge region 14 and GaAs region 14 and GaAs region 18 adjacent the heteroface junction remain N+ and P+ respectively. Thus, there are nine different combinations possible. The dopant in the GaAs may be Mg, Be or Zn for P-type conductivity for region 20; or may be Te for N-type conductivity.

In addition, aluminum gallium arsenide (Al$_x$Ga$_{1-x}$As) may be used in place of GaAs in either of regions 18 or 20, or in both of regions 18 and 20. This makes four different possible combinations, and for each of these there are nine different combinations for the conductivity type (P, N or I) in regions 12 and 20, making a total of 36 different combinations. The value of x in the formula may be any positive number less than one, the combined number of Al and Ga atoms being equal to the number of As atoms.

Thus, while preferred constructional features of the invention are embodied in the structure illustrated herein, it is to be understood that changes and variations may be made by the skilled in the art without departing from the spirit and scope of my invention.

I claim:

1. A multi-junction semiconductor device comprising:
    a heteroface junction between an inner germanium layer and an inner III-V layer including gallium and arsenic, with both of said layers including a group Ia dopant selected from lithium, sodium and potassium, so that the inner germanium layer has N+ conductivity and the inner III-V layer has P+ conductivity, and the heteroface junction has a low effective resistance in both directions.

2. A solar cell comprising the device set forth in claim 1, in which said inner germanium layer is part of a germanium wafer having an outer layer with P-type conductivity so that the inner and outer layers form a lower PN photovoltaic junction;
    in which said inner III-V layer and an outer III-V layer including gallium and arsenic form an upper PN photovoltaic junction;
    the lower and upper photovoltaic junctions having different bandgap energies, and being effectively in series through said heteroface junction.

3. A solar cell as set forth in claim 2, in which both of said III-V layers are gallium arsenide.

4. A solar cell as set forth in claim 3, further including a high bandgap aluminum gallium arsenide window on said outer III-V layer, on which there is a metallic contact and an antireflective coating, and the outer germanium layer having a metallic contact thereon.

5. A semiconductor device as set forth in claim 1, in which said inner germanium layer and an outer germanium layer of different conductivity form a junction; and in which said inner III-V layer and an outer III-V layer of different conductivity form a junction.

6. A semiconductor device as set forth in claim 5, in which said inner III-V layer and said outer III-V layer are both gallium arsenide.

7. A semiconductor device as set forth in claim 5, in which said inner III-V layer and said outer III-V layer are both aluminum gallium arsenide.

8. A semiconductor device as set forth in claim 5, in which said inner III-V layer is gallium arsenide and said outer III-V layer is aluminum gallium arsenide.

9. A semiconductor device as set forth in claim 5, in which said inner III-V layer is aluminum gallium arsenide and said outer III-V layer is gallium arsenide.

10. A semiconductor device as set forth in claim 6, 7, 8 or 9, in which said outer germanium layer has P-type conductivity.

11. A semiconductor device as set forth in claim 10, in which said outer III-V layer has N-type conductivity.

12. A semiconductor device as set forth in claim 10, in which said outer III-V layer is intrinsic.

13. A semiconductor device as set forth in claim 6, 7, 8 or 9 in which said outer germanium layer is intrinsic.

14. A semiconductor device as set forth in claim 13, in which said outer III-V layer has N-type conductivity.

15. A semiconductor device as set forth in claim 13, in which said outer III-V layer is intrinsic.

16. A semiconductor device as set forth in claim 1, in which the device comprises in order an outer germanium layer, said inner germanium layer, said inner III-V layer, and an outer III-V layer.

17. A semiconductor device as set forth in claim 16, in which said inner III-V layer and said outer III-V layer are both gallium arsenide.

18. A semiconductor device as set forth in claim 16, in which said inner III-V layer and said outer III-V layer are both aluminum gallium arsenide.

19. A semiconductor device as set forth in claim 16, in which said inner III-V layer is gallium arsenide and said outer III-V layer is aluminum gallium arsenide.

20. A semiconductor device as set forth in claim 16, in which said inner III-V layer is aluminum gallium arsenide and said outer III-V layer is gallium arsenide.

21. A semiconductor device as set forth in claim 17, 18, 19 or 20 in which said outer germanium layer has P-type conductivity, and in which said outer III-V layer has P-type conductivity.

22. A semiconductor device as set forth in claim 17, 18, 19 or 20 in which said outer germanium layer has N-type conductivity.

23. A semiconductor device as set forth in claim 22 in which said outer III-V layer has P-type conductivity.

24. A semiconductor device as set forth in claim 22 in which said outer III-V layer has N-type conductivity.

25. A semiconductor device as set forth in claim 22 in which said outer III-V layer is intrinsic.

26. A semiconductor device as set forth in claim 17, 18, 19 or 20 in which said outer germanium layer is intrinsic, and in which said outer III-V layer has P-type conductivity.

* * * * *